United States Patent
Tamura et al.

(10) Patent No.: US 7,615,163 B2
(45) Date of Patent: Nov. 10, 2009

(54) FILM FORMATION APPARATUS AND METHOD OF USING THE SAME

(75) Inventors: Akitake Tamura, Nirasaki (JP); Shigeru Nakajima, Kai (JP); Tetsushi Ozaki, Kai (JP)

(73) Assignee: Tokyo Electron Limited, Tokyo (JP)

( * ) Notice: Subject to any disclaimer, the term of this patent is extended or adjusted under 35 U.S.C. 154(b) by 486 days.

(21) Appl. No.: 11/312,760

(22) Filed: Dec. 21, 2005

(65) Prior Publication Data

US 2006/0137709 A1    Jun. 29, 2006

(30) Foreign Application Priority Data

Dec. 28, 2004  (JP) ............... 2004-381668
Nov. 1, 2005   (JP) ............... 2005-317974

(51) Int. Cl.
*H01L 21/302* (2006.01)

(52) U.S. Cl. .................. 216/63; 438/685; 438/706; 438/722; 438/785; 438/905; 134/1.3; 134/22.1

(58) Field of Classification Search .................. 216/63; 134/1.3
See application file for complete search history.

(56) References Cited

U.S. PATENT DOCUMENTS

| | | | | |
|---|---|---|---|---|
| 5,788,778 | A * | 8/1998 | Shang et al. | 134/1 |
| 6,095,158 | A * | 8/2000 | Shugrue | 134/1 |
| 6,164,295 | A * | 12/2000 | Ui et al. | 134/1.1 |
| 6,376,086 | B1 * | 4/2002 | Nagashima et al. | 428/446 |
| 6,379,575 | B1 * | 4/2002 | Yin et al. | 216/67 |
| 6,903,025 | B2 * | 6/2005 | Mizushima | 438/706 |
| 6,923,869 | B2 * | 8/2005 | Cheong | 118/724 |
| 7,140,374 | B2 * | 11/2006 | Bailey et al. | 134/22.1 |
| 7,368,384 | B2 * | 5/2008 | Endo et al. | 438/689 |
| 7,479,454 | B2 * | 1/2009 | O'Meara et al. | 438/689 |
| 7,509,962 | B2 * | 3/2009 | O'Meara et al. | 134/1.1 |
| 2002/0190024 | A1 * | 12/2002 | Eguchi et al. | 216/37 |
| 2004/0011380 | A1 * | 1/2004 | Ji et al. | 134/1.1 |
| 2004/0144320 | A1 * | 7/2004 | Hasebe et al. | 118/724 |
| 2005/0108892 | A1 * | 5/2005 | Wu et al. | 34/444 |
| 2005/0211264 | A1 * | 9/2005 | Kostenko et al. | 134/1.1 |
| 2005/0241670 | A1 * | 11/2005 | Dong et al. | 134/1.1 |
| 2005/0279384 | A1 * | 12/2005 | Guidotti | 134/18 |
| 2006/0040508 | A1 * | 2/2006 | Ji et al. | 438/758 |
| 2006/0042544 | A1 * | 3/2006 | Hasebe et al. | 118/715 |
| 2006/0175011 | A1 * | 8/2006 | Shinriki et al. | 156/345.29 |
| 2006/0213539 | A1 * | 9/2006 | Hasebe et al. | 134/22.1 |

FOREIGN PATENT DOCUMENTS

| | | |
|---|---|---|
| JP | 3-293726 | 12/1991 |
| JP | 2003-203907 | 7/2003 |
| SU | 772984 B * | 10/1980 |

* cited by examiner

*Primary Examiner*—Anita K Alanko
(74) *Attorney, Agent, or Firm*—Oblon, Spivak, McClelland, Maier & Neustadt, L.L.P.

(57) ABSTRACT

A method of using a film formation apparatus for a semiconductor process includes processing by a cleaning gas a by-product film deposited on an inner surface of a reaction chamber of the film formation apparatus. This step is arranged to supply the cleaning gas into the reaction chamber, and set an interior of the reaction chamber at a first temperature and a first pressure. The by-product film mainly contains a high-dielectric-constant material. The cleaning gas contains chlorine without containing fluorine. The first temperature and the first pressure are set to activate chlorine in the cleaning gas.

15 Claims, 4 Drawing Sheets

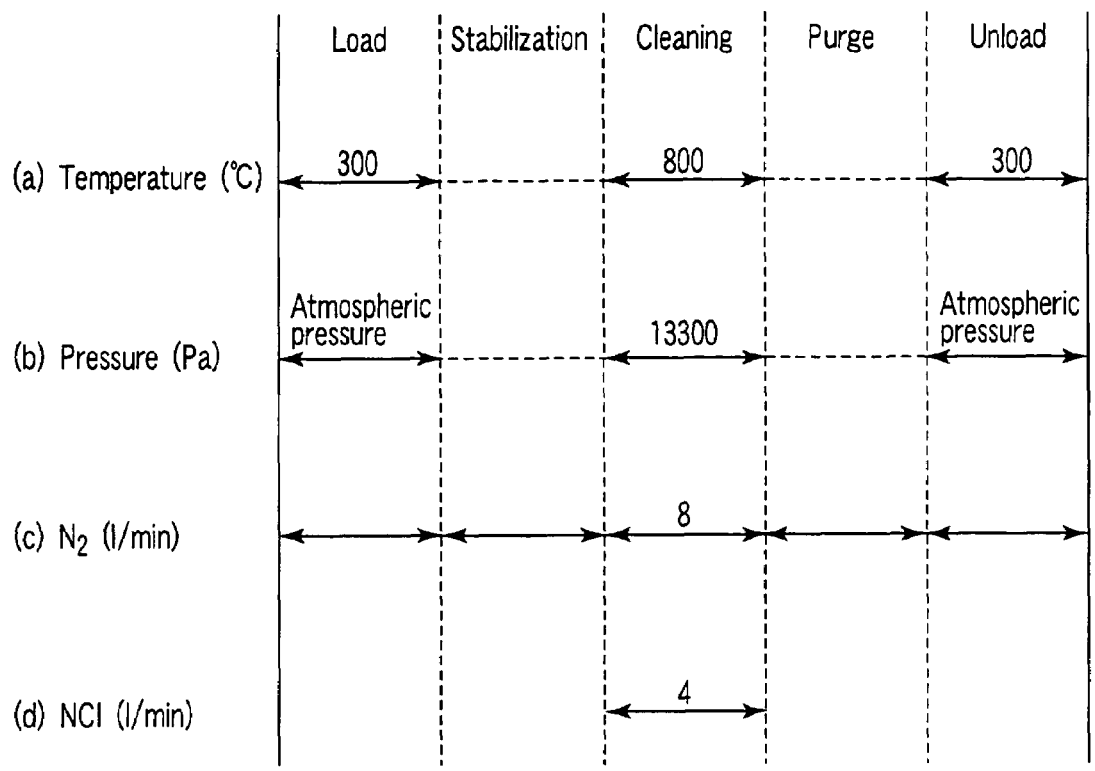
F I G. 3
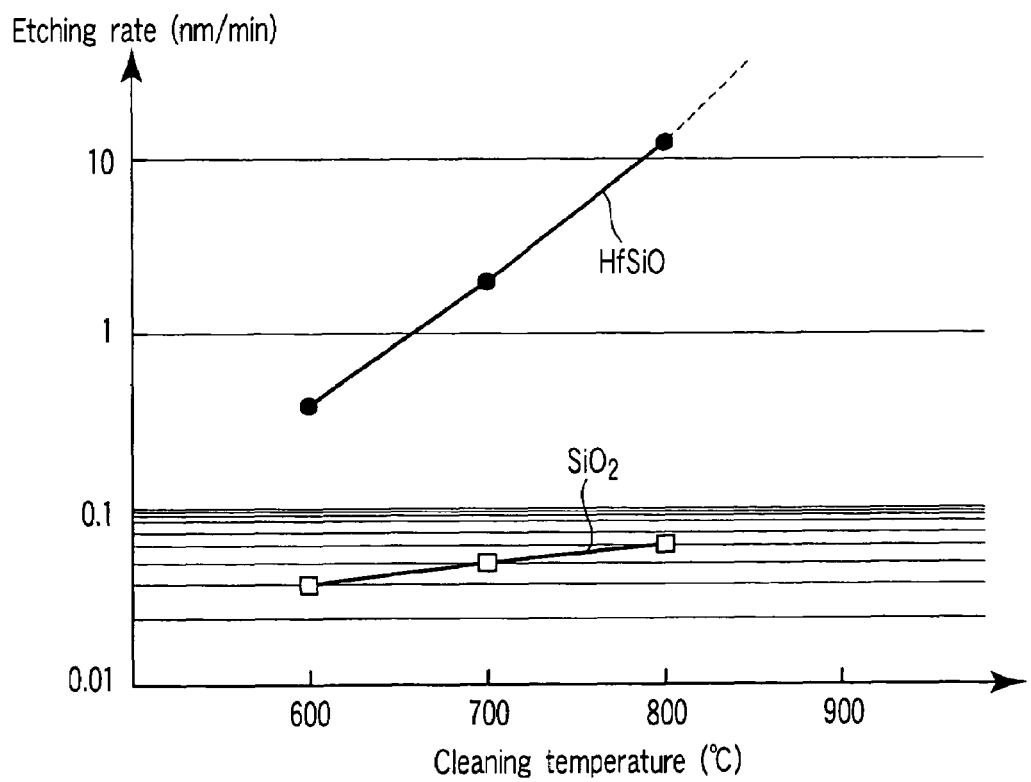
F I G. 4

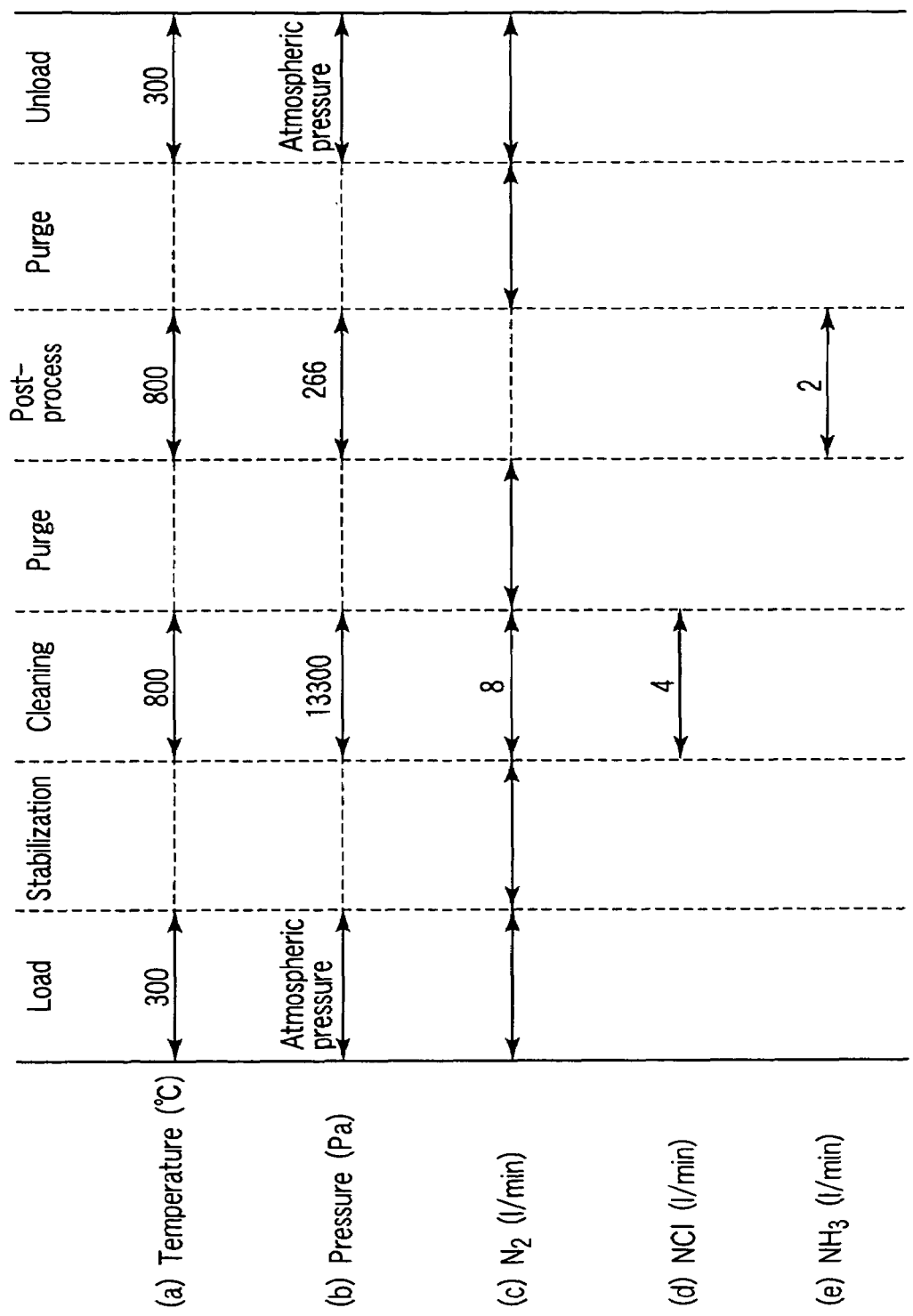
F I G. 5

FILM FORMATION APPARATUS AND METHOD OF USING THE SAME

CROSS-REFERENCE TO RELATED APPLICATIONS

This application is based upon and claims the benefit of priority from prior Japanese Patent Applications No. 2004-381668, filed Dec. 28, 2004; and No. 2005-317974, filed Nov. 1, 2005, the entire contents of both of which are incorporated herein by reference.

BACKGROUND OF THE INVENTION

1. Field of the Invention

The present invention relates to a film formation apparatus for a semiconductor process for forming a thin film of a high-dielectric-constant material on a target substrate, such as a semiconductor wafer, and also to a method of using the apparatus. The term "semiconductor process" used herein includes various kinds of processes which are performed to manufacture a semiconductor device or a structure having wiring layers, electrodes, and the like to be connected to a semiconductor device, on a target substrate, such as a semiconductor wafer or a glass substrate used for an LCD (Liquid Crystal Display) or FPD (Flat Panel Display), by forming semiconductor layers, insulating layers, and conductive layers in predetermined patterns on the target substrate.

2. Description of the Related Art

In manufacturing semiconductor devices, processes, such as CVD (Chemical Vapor Deposition), are performed to form thin films of various kinds on a target substrate, such as a semiconductor wafer. For example, a film formation process of this kind is arranged to form a thin film on a semiconductor wafer, as follows.

At first, the interior of the reaction tube (reaction chamber) of a heat-processing apparatus is heated by a heater at a predetermined load temperature, and a wafer boat that holds a plurality of semiconductor wafers is loaded. Then, the interior of the reaction tube is heated up to a predetermined process temperature, and gas inside the reaction tube is exhausted through an exhaust port, so that the pressure inside the reaction tube is reduced to a predetermined pressure.

Then, while the interior of the reaction tube is kept at the predetermined temperature and pressure (kept exhausted), a film formation gas is supplied through a process gas feed line into the reaction tube. For example, in the case of CVD, when a film formation gas is supplied into a reaction tube, the film formation gas causes a thermal reaction and thereby produces reaction products. The reaction products are deposited on the surface of each semiconductor wafer, and form a thin film on the surface of the semiconductor wafer.

Reaction products generated during the film formation process are deposited (adhered) not only on the surface of the semiconductor wafers, but also on, e.g., the inner surface of the reaction tube and other components in the tube, the latter being as by-product films. If the film formation process is continued while by-product films are present on the interior of the reaction tube, the by-product films partly separate therefrom and generate particles. The particles may drop onto the semiconductor wafers, and reduce the yield of semiconductor devices being fabricated.

In order to solve this problem, cleaning of the interior of the reaction tube is performed after the film formation process is repeated several times. In this cleaning, the interior of the reaction tube is heated at a predetermined temperature by a heater, and a cleaning gas is supplied into the reaction tube. The by-product films deposited on the inner surface of the reaction tube are dry-etched and removed by the cleaning gas. Jpn. Pat. Appln. KOKAI Publication No. 3-293726 (Patent document 1) discloses a cleaning method for removing by-product films, which contain silicon nitride as the main component, by a mixture gas of fluorine gas and a halogen-containing acid gas. However, as described later, the present inventors have found that this method cannot practically remove certain types of by-product films, such as those containing as the main component (i.e., at 50% or more) a high-dielectric-constant material (having a dielectric constant of 7 or more, hereinafter), which attracts attention in recent years.

BRIEF SUMMARY OF THE INVENTION

An object of the present invention is to provide a film formation apparatus for a semiconductor process and a method of using the same, which can efficiently perform cleaning on a by-product film containing a high-dielectric-constant material as a main component.

According to a first aspect of the present invention, there is provided a method of using a film formation apparatus for a semiconductor process, the method comprising:

processing by a cleaning gas a by-product film deposited on an inner surface of a reaction chamber of the film formation apparatus, while supplying the cleaning gas into the reaction chamber, and setting an interior of the reaction chamber at a first temperature and a first pressure, wherein the by-product film mainly contains a high-dielectric-constant material, the cleaning gas contains chlorine without containing fluorine, and the first temperature and the first pressure are set to activate chlorine in the cleaning gas.

According to a second aspect of the present invention, there is provided a film formation apparatus for a semiconductor process, comprising:

a reaction chamber configured to accommodate a target substrate;

a heater configured to heat an interior of the reaction chamber;

an exhaust system configured to exhaust the interior of the reaction chamber;

a film formation gas supply circuit configured to supply a film formation gas, for forming a high-dielectric-constant film on the target substrate, into the reaction chamber;

a cleaning gas supply circuit configured to supply a cleaning gas, containing chlorine without containing fluorine, into the reaction chamber; and a control section configured to control an operation of the apparatus, wherein the control section executes processing by the cleaning gas a by-product film deposited on an inner surface of the reaction chamber of the film formation apparatus, while supplying the cleaning gas into the reaction chamber, and setting an interior of the reaction chamber at a first temperature and a first pressure, wherein the by-product film mainly contains a high-dielectric-constant material, and the first temperature and the first pressure are set to activate chlorine in the cleaning gas.

According to a third aspect of the present invention, there is provided a computer readable medium containing program instructions for execution on a processor, which, when executed by the processor, causes a film formation apparatus for a semiconductor process to execute processing by a cleaning gas a by-product film deposited on an inner surface of a reaction chamber of the film formation apparatus, while supplying the cleaning gas into the reaction chamber, and setting an interior of the reaction chamber at a first temperature and a first pressure, wherein the by-product film mainly contains a high-dielectric-constant material, the cleaning gas contains chlorine without containing fluorine, and the first temperature and the first pressure are set to activate chlorine in the cleaning gas.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

FIG. 3 is a view showing the recipe of cleaning according to an embodiment of the present invention;

FIG. 4 is a graph showing the relationship between the cleaning temperature and etching rate of hafnium silicate (HfSiO); and FIG. 5 is a view showing the recipe of cleaning according to another embodiment of the present invention.

DETAILED DESCRIPTION OF THE INVENTION

Figure 1:
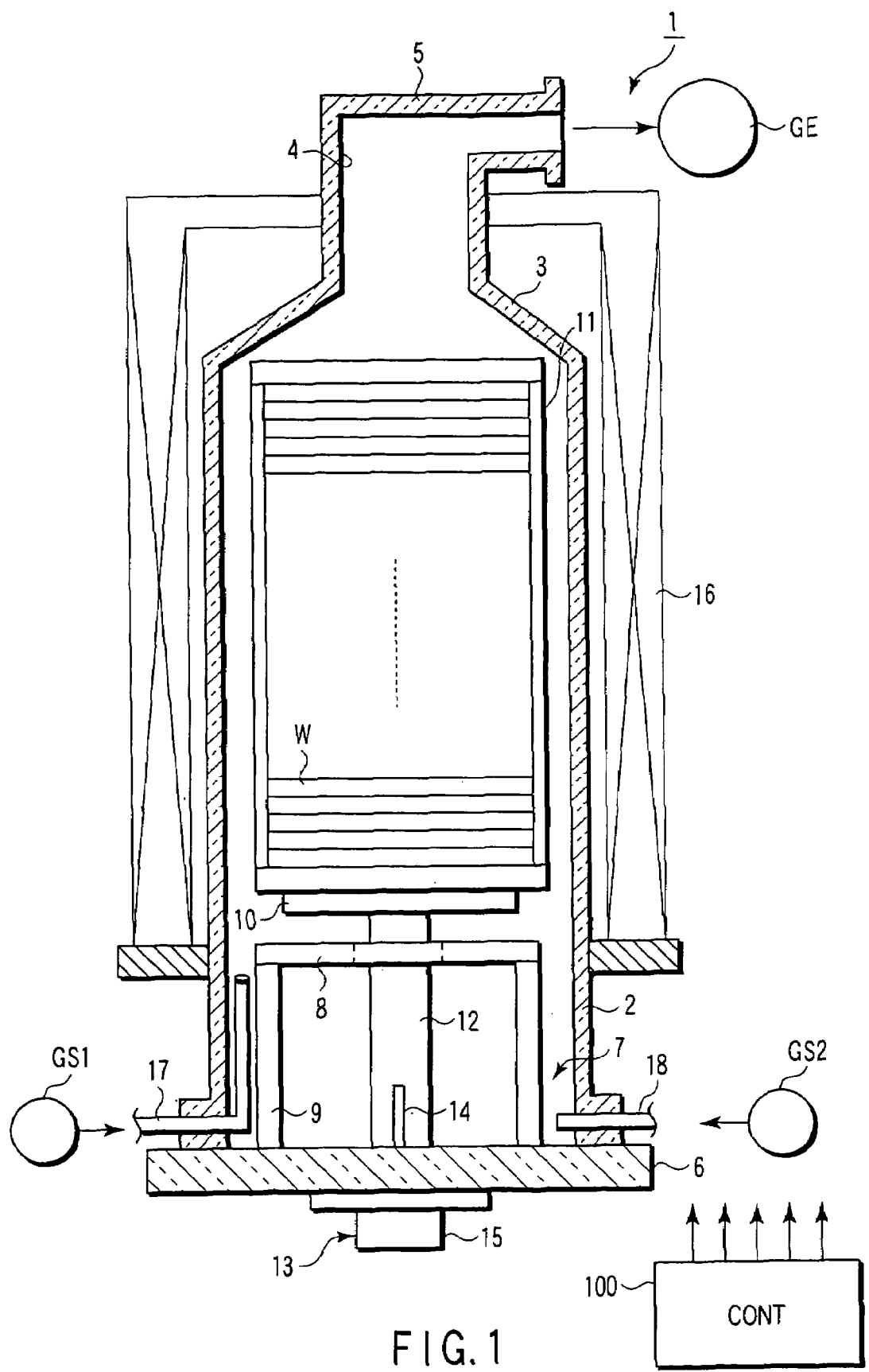
FIG. 1 is a view showing a vertical heat-processing apparatus according to an embodiment of the present invention.

In the process of developing the present invention, the inventors studied problems concerning conventional methods for cleaning the interior of a reaction tube used in a film formation apparatus for a semiconductor process. As a result, the inventors have arrived at the findings given below.

In recent years, as semiconductor devices are being more miniaturized, attention is being paid to a thin film of a high-dielectric-constant material (High-k film), which is higher in specific dielectric constant than a thin film of a silicon oxide film or silicon oxynitride film. For example, hafnium compounds have a specific dielectric constant within a range of 10 to 30, and zirconium compounds have a specific dielectric constant within a range of 10 to 25.

For example, when a hafnium oxide film is formed by CVD, by-product films containing hafnium oxide as the main component are deposited on the inner surface of the reaction tube and other components in the tube. If a conventional cleaning gas containing fluorine ($F_2$) is used to perform cleaning on the by-product films, the cleaning gas reacts with the by-product films, thereby producing hafnium fluoride ($HfF_4$). Hafnium fluoride has a low vapor pressure, and thus it is re-deposited on the inner surface of the exhaust line set at a lower temperature, and affects subsequent film formation process.

Accordingly, in the case of by-product films containing hafnium, a wet cleaning process is performed on the reaction tube to perform cleaning on the film. However, this wet etching requires work operations for detaching the reaction tube, manually cleaning the tube, and then reattaching and adjusting the tube. Further, the heat-processing apparatus needs to be shut down for a long time, thereby increasing downtime of the apparatus and lowering the operating rate thereof.

Embodiments of the present invention achieved on the basis of the findings given above will now be described with reference to the accompanying drawings. In the following description, the constituent elements having substantially the same function and arrangement are denoted by the same reference numerals, and a repetitive description will be made only when necessary.

FIG. 1 is a view showing a vertical heat-processing apparatus according to an embodiment of the present invention. This apparatus is configured as a vertical heat processing apparatus 1 of the batch type to form a hafnium silicate film. As shown in FIG. 1, the heat-processing apparatus 1 includes an essentially cylindrical reaction tube (reaction chamber) 2 whose longitudinal direction is set in the vertical direction. The reaction tube 2 is made of a heat-resistant and corrosion-resistant material, such as quartz.

The top of the reaction tube 2 is formed as an essentially conical ceiling 3 whose diameter decreases toward the top. The ceiling 3 has an exhaust port 4 formed at the center, for exhausting gas inside the reaction tube 2. The exhaust port 4 is connected to an exhaust section GE through an airtight exhaust line 5. The exhaust section GE has a pressure adjusting mechanism including, e.g., a valve and a vacuum exhaust pump (not shown in FIG. 1, but shown in FIG. 2 with a reference symbol 127). The exhaust section GE is used to exhaust the atmosphere within the reaction tube 2, and set it at a predetermined pressure (vacuum level).

A lid 6 is disposed below the reaction tube 2. The lid 6 is made of a heat-resistant and corrosion-resistant material, such as quartz. The lid 6 is moved up and down by a boat elevator described later (not shown in FIG. 1, but shown in FIG. 2 with a reference symbol 128). When the lid 6 is moved up by the boat elevator, the bottom of the reaction tube 2 (load port) is closed. When the lid 6 is moved down by the boat elevator, the bottom of the reaction tube 2 (load port) is opened.

A thermal insulation cylinder 7 is disposed on the lid 6. The thermal insulation cylinder 7 is provided with a planar heater 8 made of a resistive heating body to prevent the temperature inside the reaction tube from decreasing due to heat radiation from the load port of the reaction tube 2. The heater 8 is supported at a predetermined height level relative to the top face of the lid 6 by a cylindrical support 9.

A rotary table 10 is disposed above the thermal insulation cylinder 7. The rotary table 10 is used as a table for rotatably mounting thereon a wafer boat 11 that holds target substrates, such as semiconductor wafers W. Specifically, the rotary table 10 is connected to a rotary shaft 12 disposed therebelow. The rotary shaft 12 passes through the center of the heater 8 and is connected to a rotation mechanism 13 for rotating the rotary table 10.

The rotation mechanism 13 is mainly formed of a motor (not shown), and a rotation feeder 15 with an axle 14 that airtightly penetrates the lid 6 from below. The axle 14 is coupled to the rotary shaft 12 of the rotary table 10, to transmit the rotational force of the motor to the rotary table 10 through the rotary shaft 12. When the axle 14 is rotated by the motor of the rotation mechanism 13, the rotational force of the axle 14 is transmitted to the rotary shaft 12, and the rotary table 10 is rotated.

The wafer boat 11 is configured to hold a plurality of, e.g., 100, semiconductor wafers W at predetermined intervals in the vertical direction. The wafer boat 11 is made of a heat-resistant and corrosion-resistant material, such as quartz. Since the wafer boat 11 is mounted on the rotary table 10, the wafer boat 11 is rotated along with the rotary table 10, and thus the semiconductor wafers W held in the wafer boat 11 are rotated.

A heater 16 made of, e.g., a resistive heating body is disposed near the reaction tube 2 to surround the tube 2. The interior of the reaction tube 2 is heated by the heater 16, so that the semiconductor wafers W are heated up (increase in temperature) to a predetermined temperature.

Process gas feed lines 17 penetrate the sidewall of the reaction tube 2 near the bottom, and are used for supplying process gases (such as a film formation gas and a cleaning gas) into the reaction tube 2. Each process gas feed line 17 is connected to a process gas supply source GS1 through a mass-flow controller (MFC) described later (not shown in FIG. 1, but shown in FIG. 2 with a reference symbol 125).

For example, in order to form a hafnium silicate film on the semiconductor wafers W by CVD, the film formation gas comprises a first film formation gas containing a hafnium organic compound and a second film formation gas containing a silane family gas. Examples of the hafnium organic compounds are tetratertiarybutoxyhafnium (Hf(OC(CH$_3$)$_3$)$_4$), TEMAH (Hf(CH$_3$CH$_2$(CH$_3$)N)$_4$), TDEAH (Hf(N(C$_2$H$_5$)$_2$)$_4$), and TDMAH (Hf(N(CH$_3$)$_2$)$_4$). Examples of the silane family gas are dichlorosilane (DCS), monosilane (SiH$_4$), disilane (Si$_2$H$_6$), trisilane (Si$_3$H$_8$), hexachlorodisilane (Si$_2$Cl$_6$: HCD), hexamethyldisilazane (HMDS), tetrachlorosilane (SiHCl$_3$: TCS), disilylamine (DSA), trisilylamine (TSA), and bistertialbutylaminosilane (BTBAS)

The cleaning gas is a gas containing chlorine without containing fluorine. For example, the cleaning gas is a mixture gas of a chlorine-containing gas, such as hydrogen chloride gas or chlorine gas, with an inactive dilution gas, such as nitrogen or a rare gas. Where the cleaning gas is hydrogen chloride gas, the hydrogen chloride gas content is set to be within a range preferably of 10 to 90%, and more preferably of 25 to 40%, both by volume.

Although FIG. 1 shows only one process gas feed line 17, a plurality of process gas feed lines 17 are disposed in accordance with the type of process steps or the type of gases to be supplied into the reaction tube 2, in this embodiment. Specifically, a first film formation gas feed line for supplying the first film formation gas into the reaction tube 2, a second film formation gas feed line for supplying the second film formation gas into the reaction tube 2, and a cleaning gas feed line for supplying the cleaning gas into the reaction tube 2 penetrate the sidewall of the reaction tube 2 near the bottom.

A purge gas feed line 18 also penetrates the sidewall of the reaction tube 2 near the bottom. The purge gas feed line 18 is connected to a purge gas supply source GS2 through an MFC described later (not shown in FIG. 1, but shown in FIG. 2 with a reference symbol 125).

Figure 2:
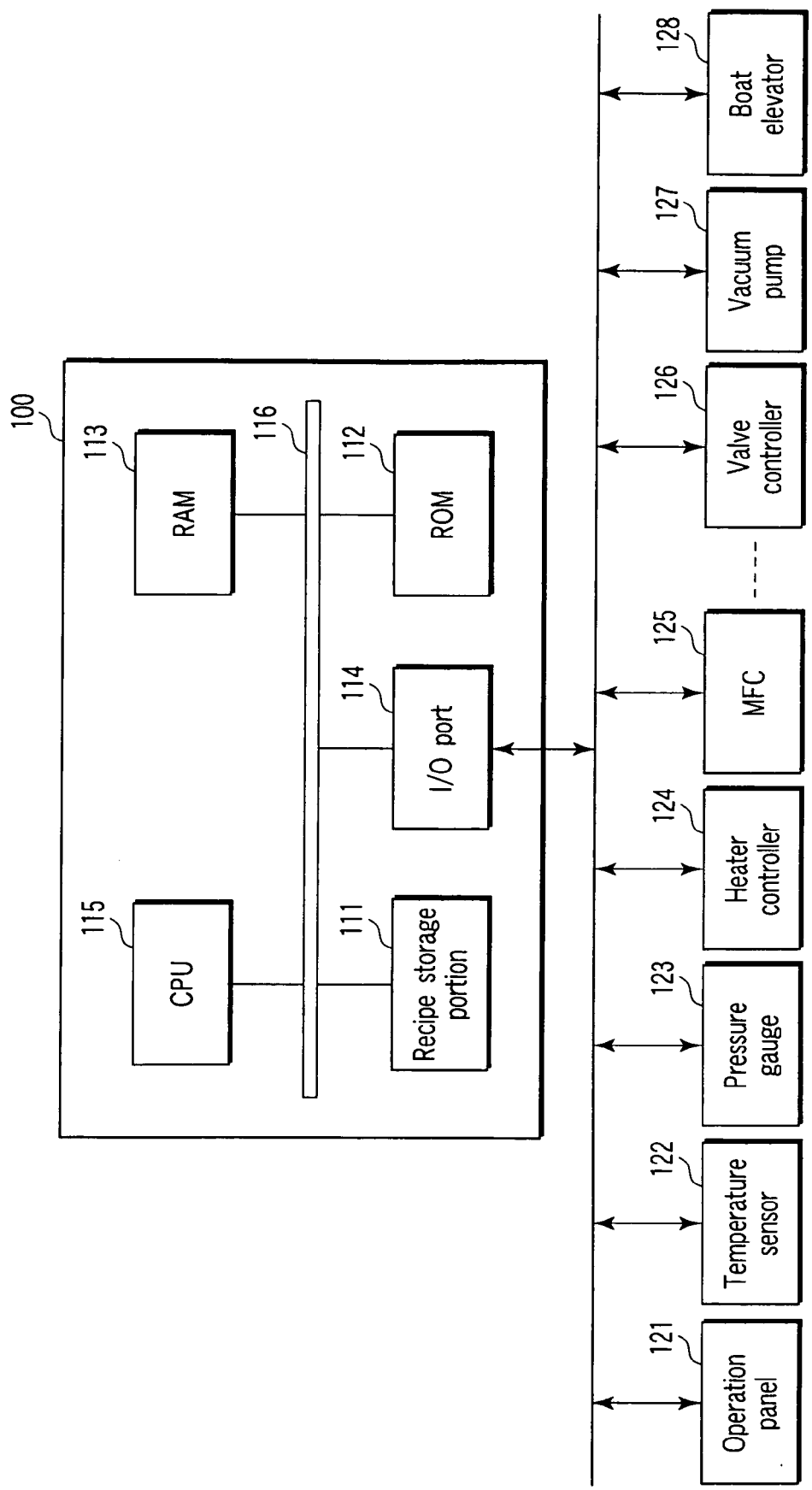
FIG. 2 is a view showing the structure of the control section of the apparatus shown in FIG. 1.

The heat-processing apparatus 1 further includes a control section 100 for controlling respective portions of the apparatus. FIG. 2 is a view showing the structure of the control section 100. As shown in FIG. 2, the control section 100 is connected to an operation panel 121, (a group of) temperature sensors 122, (a group of) pressure gages 123, a heater controller 124, MFCs 125, valve controllers 126, a vacuum pump 127, a boat elevator 128, and so forth.

The operation panel 121 includes a display screen and operation buttons, and is configured to transmit operator's instructions to the control section 100, and show various data transmitted from the control section 100 on the display screen. Temperature sensors 122 are configured to measure the temperature at respective portions inside the reaction tube 2 and exhaust line 5, and transmit measurement values to the control section 100. The pressure gages 123 are configured to measure the pressure at respective portions inside the reaction tube 2 and exhaust line 5, and transmit measurement values to the control section 100.

The heater controller 124 is configured to respectively control the heater 8 and heater 16. The heater controller 124 turns on the heater 8 and heater 16 to generate heat, in accordance with instructions from the control section 100. The heater controller 124 is also configured to measure the power consumption of the heater 8 and heater 16, and transmit it to the control section 100.

The MFCs 125 are respectively disposed on piping lines, such as the process gas feed lines 17 and purge gas feed line 18. Each MFC 125 is configured to control the flow rate of a gas flowing through the corresponding line in accordance with instructed values received from the control section 100. Further, each MFC 125 is configured to measure the flow rate of a gas actually flowing, and transmit the reading to the control section 100.

The valve controllers 126 are respectively disposed on piping lines and configured to control the opening rate of valves disposed on piping lines, in accordance with instructed values received from the control section 100. The vacuum pump 127 is connected to the exhaust line 5 and configured to exhaust gas inside the reaction tube 2.

The boat elevator 128 is configured to move up the lid 6, so as to load the wafer boat 11 (semiconductor wafers W) placed on the rotary table 10 into the reaction tube 2. The boat elevator 128 is also configured to move the lid 6 down, so as to unload the wafer boat 11 (semiconductor wafers W) placed on the rotary table 10 from the reaction tube 2.

The control section 100 includes a recipe storage portion 111, a ROM 112, a RAM 113, an I/O port 114, and a CPU 115. These members are inter-connected via a bus 116 so that data can be transmitted between them through the bus 116.

The recipe storage portion 111 stores a setup recipe and a plurality of process recipes. After the heat-processing apparatus 1 is manufactured, only the setup recipe is initially stored. The setup recipe is executed when a thermal model or the like for a specific heat-processing apparatus is formed. The process recipes are prepared respectively for heat processes to be actually performed by a user. Each process recipe prescribes temperature changes at respective portions, pressure changes inside the reaction tube 2, start/stop timing for supply of process gases, and supply rates of process gases, from the time semiconductor wafers W are loaded into the reaction tube 2 to the time processed wafers W are unloaded.

The ROM 112 is a recording medium formed of an EEPROM, flash memory, or hard disc, and is used to store operation programs executed by the CPU 115 or the like. The RAM 113 is used as a work area for the CPU 115.

The I/O port 114 is connected to the operation panel 121, temperature sensors 122, pressure gages 123, heater controller 124, MFCs 125, valve controllers 126, vacuum pump 127, and boat elevator 128, and is configured to control output/input of data or signals.

The CPU (Central Processing Unit) 115 is the hub of the control section 100. The CPU 115 is configured to run control programs stored in the ROM 112, and control an operation of the heat-processing apparatus 1, in accordance with a recipe (process recipe) stored in the recipe storage portion 111, following instructions from the operation panel 121. Specifically, the CPU 115 causes the temperature sensors 122, pressure gages 123, and MFCs 125 to measure temperatures, pressures, and flow rates at respective portions inside the reaction tube 2 and exhaust line 5. Further, the CPU 115 outputs control signals, based on measurement data, to the heater controller 124, MFCs 125, valve controllers 126, and vacuum pump 127, to control the respective portions mentioned above in accordance with a process recipe.

Next, an explanation will be given of a method of using the heat-processing apparatus 1 described above, with reference to FIGS. 3 and 4. Specifically, at first, a hafnium silicate film is formed on semiconductor wafers W within the reaction tube 2. Then, cleaning is performed on by-product films, which contain hafnium silicate as the main component or mainly contain hafnium oxide (i.e., at 50% or more), deposited inside the reaction tube 2. Specifically, the cleaning according to this embodiment is a process for removing the metal component, i.e., hafnium, from the by-product films, while leaving the silicate component therein.

The respective components of the heat-processing apparatus 1 described below are operated under the control of the control section 100 (CPU 115). The temperature and pressure inside the reaction tube 2 and the gas flow rates during the processes are set in accordance with the recipe described below, while the control section 100 (CPU 115) controls the heater controller 124 (for the heaters 8 and 16), MFCs 125 (on the process gas feed lines 17 and purge gas feed line 18), valve controllers 126, and vacuum pump 127, as described above.

In the film formation process, at first, the interior of the reaction tube 2 is heated by the heater 16 at a predetermined load temperature, such as 200° C. Further, nitrogen ($N_2$) is supplied through the purge gas feed line 18 into the reaction tube 2 at a predetermined flow rate. Then, a wafer boat 11 that holds semiconductor wafers W is placed on the lid 6, and the lid 6 is moved up by the boat elevator 128. As a consequence, the wafer boat 11 with the semiconductor wafers W supported thereon is loaded into the reaction tube 2 and the reaction tube 2 is airtightly closed (load step).

Then, nitrogen is supplied through the purge gas feed line 18 into the reaction tube 2 at a predetermined flow rate. Further, the interior of the reaction tube 2 is heated by the heater 16 to a predetermined film formation temperature (process temperature), such as a temperature within a range of 200 to 300° C. Furthermore, gas inside the reaction tube 2 is exhausted to set the interior of the reaction tube 2 at a predetermined pressure, such as a pressure within a range of 40 to 66.5 Pa (0.3 to 0.5 Torr). The pressure reduction and heating operations are performed until the reaction tube 2 is stabilized at the predetermined pressure and temperature (stabilization step).

The motor of the rotation mechanism 13 is controlled to rotate the wafer boat 11 through the rotary table 10. The wafer boat 11 is rotated along with the semiconductor wafers W supported thereon, thereby uniformly heating the semiconductor wafers W.

When the interior of the reaction tube 2 is stabilized at the predetermined pressure and temperature, the supply of nitrogen through the purge gas feed line 18 is stopped. Then, a first film formation gas containing a hafnium organic compound and a second film formation gas containing a silane family gas are supplied through respective two of the process gas feed lines 17 into the reaction tube 2. In this embodiment, the hafnium organic compound is tetratertiarybutoxyhafnium supplied at a predetermined flow rate, such as a rate within a range of 0.1 to 0.3 sccm. The silane family gas is disilane supplied at a predetermined flow rate, such as a rate within a range of 200 to 400 sccm.

The tetratertiarybutoxyhafnium and disilane supplied into the reaction tube 2 cause a thermal decomposition reaction, using heat inside the reaction tube 2. The decomposition components produce hafnium silicate (HfSiO), from which a hafnium silicate film is formed on the surface of the semiconductor wafers W (film formation step).

When the hafnium silicate film formed on the surface of the semiconductor wafers W reaches a predetermined thickness, the supply of the first and second film formation gases through the process gas feed lines 17 is stopped. Then, the interior of the reaction tube 2 is exhausted, and nitrogen is supplied through the purge gas feed line 18 at a predetermined flow rate, so that the gas inside the reaction tube 2 is exhausted to the exhaust line 5 (purge step). It is preferable to perform cycle purge, i.e., to repeat the gas exhaust and nitrogen gas supply for the interior of the process tube 2 a plurality of times, in order to reliably exhaust the gas inside the process tube 2.

Then, nitrogen is supplied through the purge gas feed line 18 into the reaction tube 2 at a predetermined flow rate, so that the pressure inside the process tube 2 is returned to atmospheric pressure. Then, the lid 6 is moved down by the boat elevator 128, and the wafer boat 11 is thereby unloaded along with the wafers W having the hafnium silicate film formed thereon (unload step).

Repeating this film formation process a plurality of times, hafnium silicate produced by the film formation process is deposited not only on the surface of semiconductor wafers W, but also on the inner surface of the reaction tube 2 and so forth, as by-product films. Accordingly, after the film formation process is repeated a plurality of times, a cleaning process is performed for the heat-processing apparatus 1.

FIG. 3 is a view showing the recipe of cleaning according to an embodiment of the present invention. In the cleaning process, at first, the interior of the reaction tube 2 is maintained by the heater 16 at a predetermined load temperature, such as 300° C., as shown in FIG. 3, (a). Further, nitrogen is supplied through the purge gas feed line 18 into the reaction tube 2 at a predetermined flow rate. Then, an empty wafer boat 11 that holds no semiconductor wafers W is placed on the lid 6, and the lid 6 is moved up by the boat elevator 128. As a consequence, the wafer boat 11 is loaded into the reaction tube 2 and the reaction tube 2 is airtightly closed (load step).

Then, nitrogen is supplied through the purge gas feed line 18 into the reaction tube 2 at a predetermined flow rate, and the interior of the reaction tube 2 is heated by the heater 16 at a predetermined cleaning temperature, such as 800° C., as shown in FIG. 3, (a). Furthermore, gas inside the reaction tube 2 is exhausted to set the interior of the reaction tube 2 at a predetermined pressure, such as 13,300 Pa (100 Torr), as shown in FIG. 3, (b). The pressure reduction and heating operations are performed until the reaction tube 2 is stabilized at the predetermined pressure and temperature (stabilization step).

When the interior of the reaction tube 2 is stabilized at the predetermined pressure and temperature, a cleaning gas is supplied through one of the process gas feed lines 17 into the reaction tube 2. In this embodiment, the cleaning gas contains hydrogen chloride (HCl) supplied at a predetermined flow rate, such as 4 liters/min, as shown in FIG. 3, (d), and nitrogen or dilution gas supplied at a predetermined flow rate, such as 8 liters/min, as shown in FIG. 3, (c).

The cleaning gas is heated in the reaction tube 2, and chlorine in the cleaning gas is activated, thereby forming a state in which a number of reactive free atoms are present. The activated chlorine comes into contact with by-product films mainly containing hafnium oxide deposited on the inner surface of the reaction tube 2 and so forth, and reacts with the metal component or hafnium of the films, thereby producing hafnium chloride ($HfCl_4$). The hafnium chloride thus produced is exhausted to the exhaust line 5 by the exhaust operation continuously performed, so only the metal component, i.e., hafnium, is removed from the by-product films, while leaving the silicate component therein (cleaning step). Since the cleaning gas does not contain any fluorine, hafnium fluoride having a low vapor pressure is not produced in the cleaning step. Consequently, it is possible to prevent a gas produced in the cleaning from being re-deposited on the inner surface of the exhaust line set at a lower temperature, and affecting subsequent film formation process.

During the cleaning step, the temperature inside the reaction tube 2 is maintained at a temperature within a range of 600 to 1,050° C., and preferably of 800 to 1,000° C. If the temperature is lower than 600° C., the hafnium removing rate from hafnium silicate becomes too low, so the cleaning cannot be efficiently performed on the by-product films. If the temperature is higher than 1,050° C., some components of the heat-processing apparatus 1, such as the exhaust line 5, may be corroded.

FIG. 4 is a graph showing the relationship between the cleaning temperature and etching rate of hafnium silicate (HfSiO). FIG. 4 also shows the relationship between the cleaning temperature and etching rate of silicon oxide ($SiO_2$: the main material of the reaction tube 2) for comparison. It should be noted that the etching rate of hafnium silicate means decrease in film thickness due to removal of the metal component (hafnium) therefrom. As shown in FIG. 4, as the cleaning temperature is set higher from 600° C., the etching rate of hafnium silicate is increased, and the selectivity of hafnium silicate/silicon oxide becomes larger. Particularly, where the cleaning temperature is set at 800° C. or more, the etching rate of hafnium silicate is much higher, so that the selectivity of hafnium silicate/silicon oxide becomes very large.

During the cleaning step, the pressure inside the reaction tube 2 is set at a pressure within a range of 6,650 Pa (50 Torr) to atmospheric pressure. Using a pressure within this range, it is possible to improve the etching uniformity as well as the etching rate and selectivity in the cleaning step.

When the by-product films deposited inside the reaction tube 2 are cleaned, the supply of the cleaning gas through the process gas feed line 17 is stopped. Then, the interior of the reaction tube 2 is exhausted, and nitrogen is supplied through the purge gas feed line 18 into the reaction tube 2 at a predetermined flow rate, so that the gas inside the reaction tube 2 is exhausted to the exhaust line 5 (purge step). It is preferable to perform cycle purge, i.e., to repeat the gas exhaust and nitrogen gas supply for the interior of the process tube 2 a plurality of times, in order to reliably exhaust the gas inside the process tube 2.

Then, the temperature inside the reaction tube 2 is lowered to a predetermined temperature, such as 300° C., as shown in FIG. 3, (a). Further, nitrogen is supplied through the purge gas feed line 18 into the reaction tube 2 at a predetermined flow rate, so that the pressure inside the process tube 2 is returned to atmospheric pressure, as shown in FIG. 3, (b). Then, the lid 6 is moved down by the boat elevator 128, and the cleaned wafer boat 11 is thereby unloaded out of the reaction tube 2 (unload step).

As the process described above is being performed, by-product films mainly containing hafnium oxide, deposited on the inner surface of the reaction tube 2, the surface of the wafer boat 11, and so forth, are cleaned. Thereafter, a wafer boat 11 with a new lot of semiconductor wafers W mounted thereon is placed on the lid 6, and the film formation process is started again in the manner described above.

Because, by removing the metal component, the by-product films are essentially changed into $SiO_2$ and fixed on the inner surface of the reaction tube 2 and so forth, they have no ill effect on the subsequent film formation process. However, when the $SiO_2$ by-product films thus formed are accumulated by repeating the processes described above and reach a certain thickness, it is preferable to etch and remove the films by, e.g., dry cleaning additionally performed. For example, in order to perform this dry cleaning, an empty wafer boat 11 that holds no semiconductor wafers W is loaded in the reaction tube 2, and a cleaning gas containing fluorine, such as HF gas, is supplied into the reaction tube 2 to etch the films.

An experiment was conducted to examine whether the cleaning shown in FIG. 3 would give a predetermined process on by-product films mainly containing hafnium oxide deposited on the inner surface of the reaction tube 2. Specifically, in accordance with the recipe of the film formation process described above, a hafnium silicate film was formed on wafers W. Then, in accordance with the recipe shown in FIG. 3, cleaning was performed on by-product films consisting essentially of hafnium oxide (HfSiO), which were deposited on the inner surface of the reaction tube 2 during the film formation process. As a result, it was confirmed that the by-product films consisting essentially of HfSiO were changed to films consisting essentially of $SiO_2$ by the cleaning.

As described above, according to the cleaning shown in FIG. 3 adopted in a method of using the heat-processing apparatus 1, where cleaning is performed on by-product films mainly containing hafnium oxide on the inner surface of the reaction tube 2, there is no need to perform wet etching, which requires work operations for detaching components and manually cleaning them. Consequently, it is possible to efficiently perform cleaning on the by-product films, thereby suppressing decrease in the operating rate of the apparatus.

FIG. 5 is a view showing the recipe of cleaning according to another embodiment of the present invention. This embodiment includes a step of removing residual chlorine inside the reaction tube 2 by a post-process gas (preferably utilizing a chemical reaction), after the step of cleaning by-product films mainly containing hafnium oxide. In this embodiment, since the post-process gas for removing chlorine is used, the process gas feed line 17 for the cleaning gas (see FIG. 1) is connected to a chlorine-containing gas source and a post-process gas source and is configured to be switchable therebetween.

In the cleaning process, at first, a load step, a stabilization step, and a cleaning step are performed, as in the embodiment shown in FIG. 3. When by-product films deposited inside the reaction tube 2 are cleaned, the supply of the cleaning gas through the process gas feed line 17 is stopped.

Then, nitrogen is supplied through the purge gas feed line 18 into the reaction tube 2 at a predetermined flow rate, as shown in FIG. 5, (c), and the interior of the reaction tube 2 is set by the heater 16 at a predetermined post-process temperature, such as 800° C., as shown in FIG. 5, (a). Further, the interior of the reaction tube 2 is exhausted, so that the pressure inside the reaction tube is reduced to a predetermined pressure, such as 266 Pa (2 Torr), as shown in FIG. 5, (b). These operations are performed until the reaction tube 2 is stabilized at the predetermined pressure and temperature (stabilization step).

When the interior of the reaction tube 2 is stabilized at the predetermined pressure and temperature, a post-process gas is supplied through the process gas feed line 17 for the cleaning gas into the reaction tube 2. In this embodiment, the post-process gas comprises ammonia ($NH_3$) is supplied at a predetermined flow rate, such as 2 liters/min, as shown in FIG. 5, (d). The post-process gas is heated and thereby activated in the reaction tube 2, and reacts with residual chlorine within the inner space of the reaction tube 2 and in the surface of components inside the reaction tube 2, thereby producing ammonium chloride $NH_4Cl$. The ammonium chloride thus produced is exhausted to the exhaust line 5 by the exhaust operation continuously performed, so the residual chlorine inside the reaction tube 2 is removed (post-process step).

Where the post-process gas comprises ammonia ($NH_3$), the temperature inside the reaction tube 2 during the post-process step is maintained at a temperature within a range of 600 to 1,000° C., and preferably of 800 to 850° C. If the temperature is lower than 600° C., the reaction rate of ammonia with chlorine becomes too low. If the temperature is higher than 1,000° C., some components of the heat-processing apparatus 1, such as the exhaust line 5, may be corroded. During the post-process step, the pressure inside the reaction tube 2 is set at a pressure within a range of 133 Pa (1 Torr) to 1,330 Pa (10 Torr). Using a pressure within this range, it is possible to efficiently remove chlorine.

The post-process gas has an ammonia content within a range preferably of 10 to 100%, and more preferably of substantially 100%, both by volume. However, the post-process gas can be any gas as long as it can remove residual chlorine inside the reaction tube 2, and, for example, it may be a gas utilizing no chemical reaction, such as nitrogen ($N_2$) gas. The temperature and pressure inside the reaction tube 2 differ depending on the type of the post-process gas, so that they are set to remove chlorine contained in the reaction tube 2 and so forth.

When the residual chlorine inside the reaction tube 2 is removed, the supply of post-process gas through the process gas feed line 17 is stopped. Then, the interior of the reaction tube 2 is exhausted, and nitrogen is supplied through the purge gas feed line 18 into the reaction tube 2 at a predetermined flow rate, so that the gas inside the reaction tube 2 is exhausted to the exhaust line 5 (purge step). It is preferable to perform cycle purge, i.e., to repeat the gas exhaust and nitrogen gas supply for the interior of the process tube 2 a plurality of times, in order to reliably exhaust the gas inside the process tube 2.

Then, the temperature inside the reaction tube 2 is lowered to a predetermined temperature, such as 300° C., as shown in FIG. 5, (a). Further, nitrogen is supplied through the purge gas feed line 18 into the reaction tube 2 at a predetermined flow rate, so that the pressure inside the process tube 2 is returned to atmospheric pressure, as shown in FIG. 5, (b). Then, the lid 6 is moved down by the boat elevator 128, and the cleaned wafer boat 11 is thereby unloaded out of the reaction tube 2 (unload step).

As the process described above is being performed, by-product films mainly containing hafnium oxide, deposited on the inner surface of the reaction tube 2, the surface of the wafer boat 11, and so forth, are cleaned, and then residual chlorine within the inner space of the reaction tube 2 and in the surface of components inside the reaction tube 2 are removed. Thereafter, a wafer boat 11 with a new lot of semiconductor wafers W mounted thereon is placed on the lid 6, and the film formation process is started again in the manner described above.

An experiment was conducted to examine whether the cleaning shown in FIG. 5 would remove residual chlorine present in the surface of components inside the reaction tube 2. Specifically, quartz chips were supported by the wafer boat 11 and subjected to a cleaning process. The concentration of chlorine (Cl) in the quartz chips was measured before the post-process step (after the cleaning step), and after the post-process step. The chlorine concentration was measured by secondary ion mass spectrometry (SIMS measurement). As a result, the chlorine concentration was $2\times10^{19}$ atoms/cm$^3$ after the cleaning step, and it was $1\times10^{18}$ atoms/cm$^3$ after the post-process step. Accordingly, it was confirmed that the concentration of chlorine (Cl) in the quartz chips was greatly reduced by the post-process step (specifically, decreased to $\frac{1}{20}$).

As described above, according to the cleaning shown in FIG. 5 adopted in a method of using the heat-processing apparatus 1, the concentration of residual chlorine present within the inner space of the reaction tube 2 and in the surface of components inside the reaction tube 2 is greatly decreased. Consequently, a thin film formed on semiconductor wafers W thereafter can be prevented from being contaminated with chlorine. In other words, according to this embodiment, it is possible to improve the quality of a thin film formed on wafers, in addition to the effects obtained by the former embodiment.

In the embodiments described above, by-product films contain hafnium silicate as the main component. However, the present invention may be applied to a case where by-product films contain another high-dielectric-constant material as the main component. An example of another metal silicate (high-dielectric-constant material) composing by-product films is zirconium silicate, wherein the metal component can be removed from the films, while leaving the silicate component therein. Examples of another high-dielectric-constant material to which the present invention is applicable are hafnium oxide ($HfO_2$), hafnium aluminate (HfAlO), and zirconium oxide ($ZrO_2$). For example, where the high-dielectric-constant material is aluminum oxide, the temperature inside the reaction tube 2 during the cleaning step is set at 600° C. or more, and preferably at 850° C. or more. Plasma, tungsten catalyst, or ultraviolet light may be utilized to activate chlorine in the cleaning gas, thereby lowering the temperature inside the reaction tube 2.

In the embodiments described above, the cleaning gas is a mixture gas of hydrogen chloride gas with nitrogen gas. However, the present invention may utilize another cleaning gas (containing chlorine without containing fluorine). An example of another cleaning gas is a mixture gas of chlorine ($Cl_2$) gas with nitrogen gas. The amount of a chlorine-containing gas in the cleaning gas may be flexibly set as long as it can clean by-product films mainly containing a high-dielectric-constant material. However, as described previously, where the cleaning gas is hydrogen chloride gas, the hydrogen chloride gas content is set to be within a range preferably of 10 to 90%, and more preferably of 25 to 40%, both by volume.

In the embodiments described above, the cleaning gas contains nitrogen gas as a dilution gas. The cleaning gas preferably contains a dilution gas, because the process time can be more easily controlled if it is so arranged. However, the cleaning gas may contain no dilution gas. The dilution gas consists preferably of an inactive gas, such as nitrogen gas, helium gas (He), neon gas (Ne), or argon gas (Ar).

In the embodiment described above, the process gas feed lines 17 are disposed in accordance with the type of process steps. Alternatively, for example, a plurality of process gas feed lines 17 may be disposed in accordance with the type of gases. Further, a plurality of process gas feed lines 17 may be connected to the sidewall of the reaction tube 2 near the bottom, to supply each gas through a plurality of lines. In this case, a process gas is supplied through the plurality of process gas feed lines 17 into the reaction tube 2, and thereby more uniformly spreads in the reaction tube 2.

In the embodiments described above, the heat-processing apparatus employed is a heat-processing apparatus of the batch type having a single-tube structure. However, for example, the present invention may be applied to a vertical heat-processing apparatus of the batch type having a reaction tube 2 of the double-tube type, which is formed of inner and outer tubes. Alternatively, the present invention may be applied to a heat-processing apparatus of the single-substrate type. The target substrate is not limited to a semiconductor wafer W, and it may be a glass substrate for, e.g., an LCD.

The control section 100 of the heat-processing apparatus is not limited to a specific system, and it may be realized by an ordinary computer system. For example, a program for executing the process described above may be installed into a multi-purpose computer, using a recording medium (a flexible disk, CD-ROM, or the like) with the program stored therein, so as to prepare the control section 100 for executing the process described above.

Means for supplying a program of this kind are diverse. For example, a program may be supplied by a communication line, communication network, or communication system, in place of a predetermined recording medium, as described above. In this case, for example, a program may be pasted on a bulletin board (BBS) on a communication network, and then supplied through a network while being superimposed on a carrier wave. The program thus provided would then be activated and ran under the control of the OS of the computer, as in the other application programs, thereby executing the process.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of using a film formation apparatus for a semiconductor process, the method comprising:
    processing by a cleaning gas a by-product film deposited on an inner surface of a reaction chamber of the film formation apparatus, while supplying the cleaning gas into the reaction chamber;
    setting an interior of the reaction chamber at a first temperature and a first pressure, wherein the by-product film mainly contains metal silicate having a dielectric constant of 7 or more, the cleaning gas contains a mixture gas of hydrogen chloride gas or chlorine gas with an inactive dilution gas without containing fluorine, and the first temperature and the first pressure are set to be within a range of 800 to 1,000° C. and within a range of 6,650 Pa (50 Torr) to atmospheric pressure, respectively, so as to activate chlorine in the cleaning gas and to remove a metal component from the by-product film while leaving a silicate component therein; and
    performing dry cleaning to etch the by-product film, from which the metal component has been removed, while supplying a second cleaning gas containing fluorine into the reaction chamber.

2. The method according to claim 1, wherein the metal silicate is hafnium silicate or zirconium silicate.

3. The method according to claim 1, wherein the cleaning gas contains hydrogen chloride gas within a range of 10 to 90% by volume.

4. The method according to claim 1, further comprising removing residual chlorine inside the reaction chamber by utilizing a chemical reaction with a post-process gas after processing the by-product film, while supplying the post-process gas into the reaction chamber, and setting the interior of the reaction chamber at a second temperature and a second pressure to activate the post-process gas.

5. The method according to claim 4, wherein the second temperature is set to be within a range of 600 to 1,000° C.

6. The method according to claim 4, wherein the second pressure is set to be within a range of 133 Pa (1 Torr) to 1,330 Pa (10 Torr).

7. The method according to claim 4, wherein the post-process gas contains ammonia within a range of 10 to 100% by volume.

8. The method according to claim 4, further comprising supplying an inactive gas into the reaction chamber to purge the interior thereof, between processing the by-product film and removing the residual chlorine.

9. The method according to claim 1, further comprising forming film of the metal silicate by CVD on a target substrate within the reaction chamber, during which the by-product film is deposited on the inner surface of the reaction chamber, before processing the by-product film.

10. The method according to claim 9, wherein forming the film of the metal silicate comprises supplying a first film formation gas containing a metal organic compound and a second film formation gas containing a silane family gas into the reaction chamber.

11. A method of using a film formation apparatus for a semiconductor process, the method comprising:
    forming a hafnium silicate film by CVD on a target substrate within a reaction chamber of the film formation apparatus while supplying a first film formation gas containing a hafnium organic compound and a second film formation gas containing a silane family gas into the reaction chamber, during which a by-product film mainly containing hafnium silicate is deposited on an inner surface of the reaction chamber;
    processing by a cleaning gas the by-product film deposited on the inner surface of the reaction chamber, while supplying the cleaning gas into the reaction chamber, and setting an interior of the reaction chamber at a first temperature and a first pressure, wherein the cleaning gas comprises a mixture gas of hydrogen chloride gas or chlorine gas with an inactive dilution gas without containing fluorine, and the first temperature and the first pressure are set to be within a range of 800 to 1,000° C. and within a range of 6,650 Pa (50 Torr) to atmospheric pressure, respectively, so as to activate chlorine in the cleaning gas and to remove a hafnium component from the by-product film while leaving a silicate component therein; and
    performing dry cleaning, after the processing the by-product film, to etch the by-product film, from which the hafnium component has been removed, while supplying a second cleaning gas containing fluorine into the reaction chamber.

12. The method according to claim 11, wherein the cleaning gas comprises a mixture gas of hydrogen chloride gas with nitrogen gas used as the inactive dilution gas, and contains the hydrogen chloride gas within a range of 10 to 90% by volume.

13. The method according to claim 12, wherein the cleaning gas contains the hydrogen chloride gas within a range of 25 to 40% by volume.

14. The method according to claim 11, wherein, after processing the by-product film, the method further comprises removing residual chlorine inside the reaction chamber by utilizing a chemical reaction with a post-process gas containing ammonia within a range of 10 to 100% by volume, while supplying the post-process gas into the reaction chamber, and setting the interior of the reaction chamber at a second temperature within a range of 600 to 1,000° C. and a second pressure to activate the post-process gas within a range of 133 Pa (1 Torr) to 1,330 Pa (10 Torr).

15. The method according to claim 14, wherein, between processing the by-product film and removing the residual chlorine, the method further comprises supplying an inactive gas into the reaction chamber to purge the interior thereof.

* * * * *